(12) United States Patent
Boettiger et al.

(10) Patent No.: US 7,280,278 B2
(45) Date of Patent: Oct. 9, 2007

(54) APPARATUS AND METHOD FOR MANUFACTURING POSITIVE OR NEGATIVE MICROLENSES

(75) Inventors: Ulrich C. Boettiger, Boise, ID (US); Jin Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/857,948

(22) Filed: Jun. 2, 2004

(65) Prior Publication Data

US 2005/0270651 A1 Dec. 8, 2005

(51) Int. Cl.
*G02B 27/10* (2006.01)

(52) U.S. Cl. .................. 359/619; 359/628; 349/95; 264/1.32

(58) Field of Classification Search ........ 359/619–628; 349/95; 264/1.1, 1.32, 1.38, 2.2
See application file for complete search history.

(56) References Cited

U.S. PATENT DOCUMENTS

| | | | |
|---|---|---|---|
| 5,371,397 A | | 12/1994 | Maegawa et al. |
| 5,435,887 A | | 7/1995 | Rothschild et al. |
| 5,581,379 A | * | 12/1996 | Aoyama et al. ............... 349/5 |
| 5,593,913 A | | 1/1997 | Aoki |
| 5,672,519 A | | 9/1997 | Song et al. |
| 5,694,246 A | | 12/1997 | Aoyama et al. |
| 5,877,040 A | | 3/1999 | Park et al. |
| 5,977,535 A | | 11/1999 | Rostoker |
| 6,259,083 B1 | | 7/2001 | Kimura |
| 6,411,439 B2 | | 6/2002 | Nishikawa |
| 6,618,201 B2 | * | 9/2003 | Nishikawa et al. ......... 359/619 |
| 6,621,637 B2 | * | 9/2003 | Uchiyama et al. .......... 359/619 |
| 6,856,462 B1 | * | 2/2005 | Scarbrough et al. ........ 359/619 |
| 6,919,991 B2 | * | 7/2005 | Koyama ..................... 359/619 |
| 6,940,654 B1 | * | 9/2005 | Tang .......................... 359/619 |
| 2005/0007669 A1 | * | 1/2005 | Sakai ........................ 359/619 |

OTHER PUBLICATIONS

Shen, X.-J., Pan, Li-Wei and Lin, Liwei, *Microplastic Embossing Process: Emperimental and Theoretical Characterizations*; Elsevier Science B.V., Sensors and Actuators A 97-98, (2002), pp. 428-433.
Hamdorf, Marc and Johannsmann, Diethelm, *Surface-rheological Measurements on Glass Forming Polymers Based on the Surface Tension Driven Decay of Imprinted Corrugation Gratings*, Journal of Chemical Physics, vol. 112, No. 9 (Mar. 1, 2000), pp. 4262-4270.
*Intrinsic Viscosity and Its Relation to Intrinsic Conductivity* [online], [retrieved on Oct. 30, 2003]. Retrieved from the Internet:<URL: http://ciks.cbt.nist.gov/garbocz/paper58/node3.html>.

* cited by examiner

*Primary Examiner*—Huy Mai
(74) *Attorney, Agent, or Firm*—Dickstein Shapiro LLP

(57) ABSTRACT

A variety of structures and methods used to adjust the shape, radius and/or height of a microlens for a pixel array. The structures affect volume and surface force parameters during microlens formation. Exemplary microlens structures include a microlens frame, base, material, protrusions or a combination thereof to affect the shape, height and/or radius of the microlens. The frame, base and/or protrusions alter the microlens flow resulting from the heating of the microlens during fabrication such that a height or radius of the microlens can be controlled. The radius can be adjusted by the height differences between the microlens and frame. The bigger the difference, the smaller the radius will be.

71 Claims, 15 Drawing Sheets

After Heating
Lens Material

Before Heating
Lens Material

After Heating
Lens Material

US 7,280,278 B2

APPARATUS AND METHOD FOR MANUFACTURING POSITIVE OR NEGATIVE MICROLENSES

FIELD OF THE INVENTION

The invention relates to fabrication of microlens structures for image capture or display systems, and more specifically to structures and methods of manufacturing of microlens arrays for solid state imager systems.

BACKGROUND OF THE INVENTION

Solid state imagers, including charge coupled devices (CCD) and CMOS sensors, have been commonly used in photo imaging applications. A solid state imager circuit includes a focal plane array of pixel cells, each one of the cells including either a photogate, photoconductor or a photodiode having a doped region for accumulating photo-generated charge. Microlenses are commonly placed over imager pixel cells. A microlens is used to focus light onto the initial charge accumulation region. Conventional technology uses a single microlens with a polymer coating, which is patterned into squares or circles provided respectively over the pixels which are then heated during manufacturing to shape and cure the microlens.

Use of microlenses significantly improves the photosensitivity of the imaging device by collecting light from a large light collecting area and focusing it on a small photosensitive area of the sensor. The ratio of the overall light collecting area to the photosensitive area of the sensor is known as the pixel's fill factor.

The use of smaller sized microlens arrays is of increasing importance in microlens optics. One reason for increased interest in reducing the size of microlenses is the increased need to reduce the size of imager devices and increase imager resolution. However, reductions in pixel sizes result in a smaller charge accumulation area in individual pixels in the array. Reduced sizes of pixels result in smaller accumulated charges which are read out and processed by signal processing circuits.

As the size of imager arrays and photosensitive regions of pixels decreases, it becomes increasingly difficult to provide a microlens capable of focusing incident light rays onto the photosensitive regions. This problem is due in part to the increased difficulty in constructing a smaller microlens that has the optimal focal characteristics for the imager device process and that optimally adjusts for optical aberrations introduced as the light passes through the various device layers. Also, it is difficult to correct possible distortions created by multiple regions above the photosensitive area, which results in increased crosstalk between adjacent pixels. "Crosstalk" can result when off-axis light strikes a microlens at an obtuse angle. The off-axis light passes through planarization regions and a color filter, misses the intended photosensitive region and instead strikes an adjacent photo sensitive region.

Microlens shaping and fabrication through heating and melting microlens materials also becomes increasingly difficult as microlens structures decrease in size. Previous approaches to control microlens shaping and fabrication do not provide sufficient control to ensure optical properties such as focal characteristics, radius of a microlens or other parameters needed to provide a desired focal effect for smaller microlens designs. Consequently, imagers with smaller sized microlenses have difficulty in achieving high color fidelity and signal/noise ratios.

BRIEF SUMMARY OF THE INVENTION

The various exemplary embodiments of the invention provide a variety of structures and methods used to adjust the shape, radius and/or height of a microlens for a pixel array. The embodiments use structures that affect volume and surface force parameters during microlens formation. Exemplary embodiments are directed to a microlens structure that includes a microlens frame, base, material, protrusions or a combination thereof to affect the shape, height and/or radius of the microlens. The frame, base and/or protrusions alter the microlens flow resulting from the heating of the microlens during fabrication such that a height or radius of the microlens can be controlled. The radius can be adjusted by the height differences between the microlens and frame. The bigger the difference, the smaller the radius will be.

BRIEF DESCRIPTION OF THE DRAWINGS

Various exemplary embodiments of structures and methods of their manufacture are discussed in detail below. These embodiments and other features of the invention are described in more detail below in connection with the accompanying drawings, in which.

DETAILED DESCRIPTION OF THE INVENTION

Figure 1:
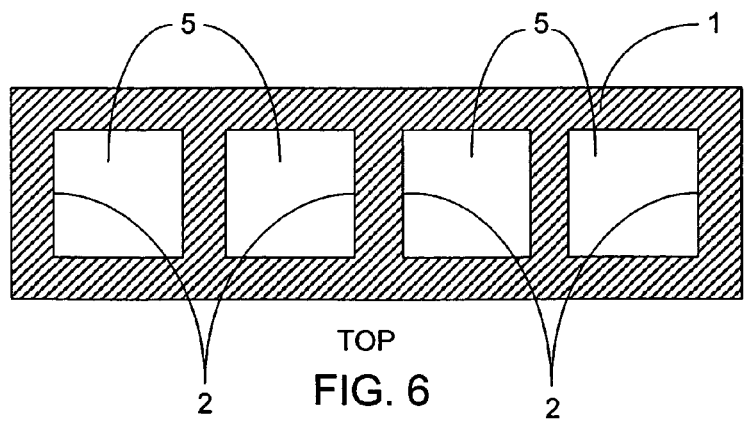
FIG. 1 shows cross sectional view of a portion of an imager structure constructed in accordance with an exemplary embodiment of the invention.

Exemplary embodiments of the invention affect or adjust microlens shapes or optical properties during lens formation (e.g., heating of lens material thereby causing lens material to flow or settle into an intended microlens shape). Microlens frames and/or other structures are used to affect or alter the flow behavior of lens material to be different than otherwise would occur without use of a microlens frame or other flow behavior altering structures.

According to the invention, the focal characteristics of a microlens can be adjusted by, among other things, forming boundary walls around lens materials to contain/limit the outward flow of lens material. This adjusts microlens flow behavior, e.g., increasing microlens height or defining a perimeter of the microlens structures. Boundary walls can be formed by formation of cavities or frame sidewalls with microlens material deposited therein. Post-flow microlens shapes can also be adjusted or affected by use of structures formed within the microlens materials (for example, a microlens base within a microlens material) that change flow behavior of the microlens during microlens flow processing (e.g., altering a shape of the microlens or increasing the height of the microlens from a planar layer or a microlens cavity).

Radius, shape, height and optical properties of a microlens can be adjusted independently of other microlens design parameters by using structures, materials and/or fabrication processing techniques to affect the microlens melting or flow behavior during fabrication. As used herein, a positive microlens includes a microlens extending above a layer or above a microlens cavity (e.g., a convex microlens) and a negative microlens includes a microlens that does not extend outside the microlens cavity or below the layer (e.g., a concave microlens).

A first exemplary embodiment provides an alteration of the balance of surface and volume related forces by creating a microlens within an enclosure or frame; this results in an altered radius, height or shape of the microlens (after heating and subsequent flowing of melted microlens material). A variety of enclosure or frame shapes and dimensions can be used to create the microlens with a desired radius, height, shape and/or optical property.

A second exemplary embodiment creates a filler or base layer that is covered with a microlens material layer. The radius, height and/or shape at the microlens layer are affected by the base layer during microlens formation.

A third exemplary embodiment forms columns or blocks on a floor of a microlens enclosure or a microlens base layer. The microlens is formed around and over the blocks or columns thereby affecting microlens formation (e.g., flowing behavior).

A fourth exemplary embodiment employs asymmetrical, varied or non-uniformed shaped enclosures, frames, base layers and/or columns to alter microlens formation by changing flow behavior during microlens formation.

Combinations of the exemplary embodiments may also be used to control shaping of a microlens structure in order to adjust a microlens shape, focal characteristics, radius or other microlens attributes or properties.

Microlens material is heated and flowed during microlens fabrication by melting the microlens material, resulting in a flow of the deposited material into a desired shape. For example, a rectangular block of microlens material formed on a planar surface will assume a semi-spherical shaped microlens (e.g., microlens 11, FIG. 7) after being heated to 170° C. to 180° C. (depending on resist) due to the melting and flowing of the microlens material. The term "flow", "flowing" or "reflowing" refers to a change in shape of a material which is heated and melts thereby producing a material flow or shape alteration in the material caused by heating or other similar process. "Flow" is an initial melting and "reflow" is a subsequent melting of a frame or microlens material that has been previously flowed.

A first exemplary embodiment of the invention is now described with reference to FIG. 1. FIG. 1 shows a cross section of a microlens frame having openings 5, which are subsequently filled with lens material to form a microlens. The frames 5 are formed over a substrate 3 having photosensor devices 4 therein. The frame openings 5 are formed within a planar layer 1 formed over the substrate 3 using methods well known in the art such as etching or patterning. Frame openings 5 are defined by frame opening sidewalls 2 and a flat floor portion 7. Frame openings 5 may be formed by etching, by patterning photo resist for example. It should be appreciated that other circuitry components and material layers are not shown for purposes of simplifying the illustration of FIG. 1 and other figures herein.

Figure 1A:
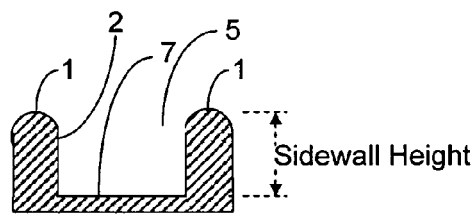
FIG. 1A shows a cross sectional view of a portion of a microlens structure constructed in accordance with an exemplary embodiment of the invention.
Figure 1B:
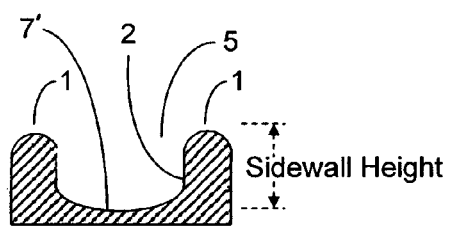
FIG. 1B shows a cross sectional view of a portion of a microlens structure constructed in accordance with another exemplary embodiment of the invention.

FIG. 1A shows a view of a single exemplary frame opening 5 within the planar layer 1 of FIG. 1 having a flat floor portion 7. Alternatively, FIG. 1B shows a FIG. 1 frame opening 5 with a curved floor portion 7', which can be used to affect the after flowing form (i.e., shape) of a microlens structure. The sidewalls 2 and floor portion 7 define a volume within the frame opening 5. As is discussed below, microlens material is deposited into the frame opening 5 and then heated to flow or melt into a desired shape and form.

As noted, FIG. 1B shows an exemplary embodiment of the invention with a frame opening floor 7' that has a curved variable depth from the plane formed by a top section of the frame opening 5. Microlens material is deposited onto the curved floor portion 7' and into the frame opening 5 defined by sidewalls 2. For sufficiently thin microlens films, the curved floor 7' affects the flowing of microlens material in a similar manner as when a water droplet is placed into a hollowed depression in a surface. When the microlens material in curved floor portion 7' flows during heating, the hollow of floor portion 7' will support or cup the microlens material such that it will not settle as much as it would if the microlens material were on a flat surface (e.g., floor portion 7, FIG. 1A). A curved, convex or other non-planar shaped floor portion can be used with any of the embodiments of the invention to achieve a desired change to a flowed microlens material. Also, sidewalls 2 in any of the embodiments of the invention can be convex or concave as well as other non-planar shapes as well.

Figure 2:
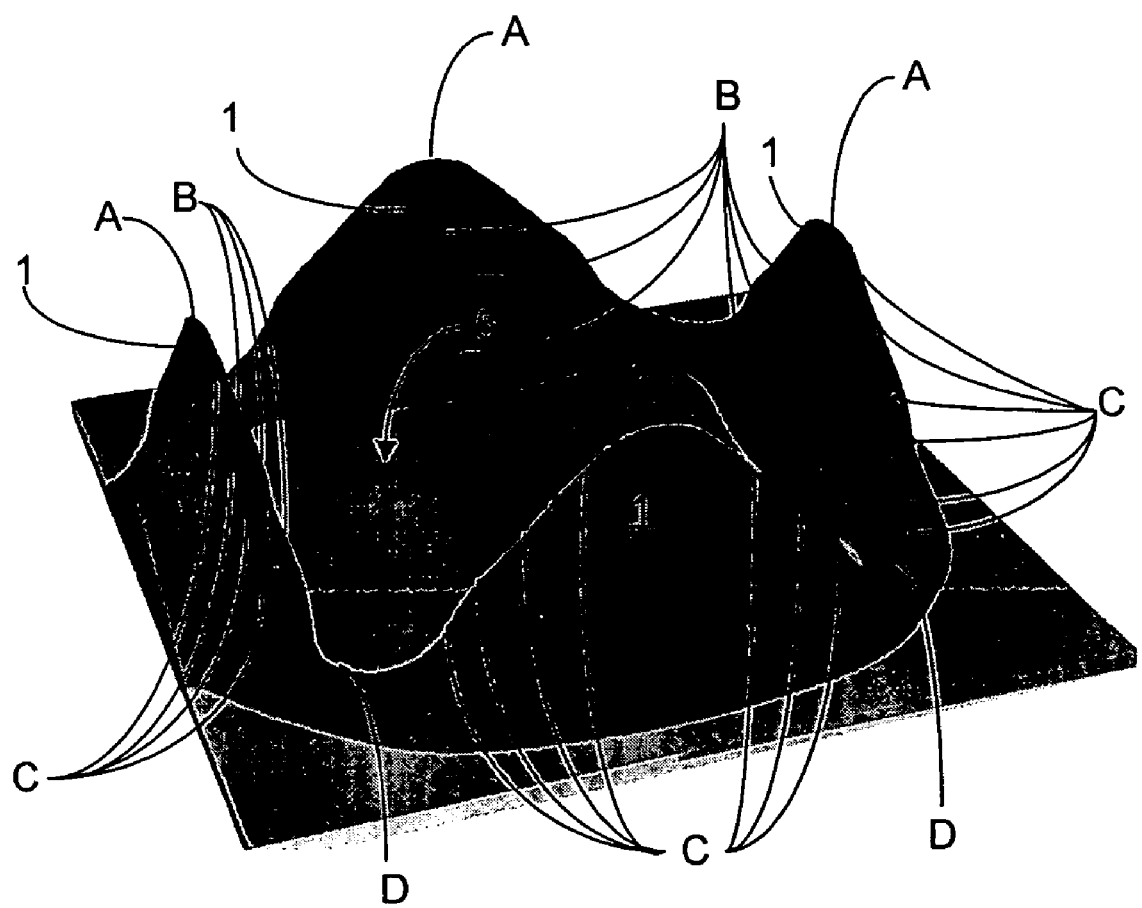
FIG. 2 shows a perspective view of an imager structure constructed in accordance with another exemplary embodiment of the invention.

FIG. 2 shows a perspective view of another embodiment of a frame that has been formed with sidewalls 1 that are sloped in two dimensions. The frame sidewalls 1 have a portion B that slopes down and inwardly from a top center portion A of the sidewalls towards the center of an opening 5 defined by the frame sidewalls 1. The frame sidewalls 1 also have a portion C that slopes down laterally on both sides towards corner areas from a center top portion A of the sidewalls, thereby forming notch like openings D in the corner areas of the frame. The multi-dimension sidewall shapes can be used to selectively alter and direct flow behavior of microlens material during liquid phase transitions of microlens materials deposited in opening 5 during microlens flow processing.

The dimensions, shape, volume of lens frame opening (e.g., opening 5), focal length and other focal characteristics in all embodiments herein that use frames are determined by one or more microlens and imager design parameters including: (1) the distance, width or size of the photosensor 4 underneath the frame opening 5 the microlens focuses light upon; (2) the viscosity of the microlens material used to form the microlenses during heating; (3) the structures or frame opening sidewall dimensions (e.g., sidewall 2 height profiles) that affect microlens formation; (4) the alterations in flow behavior of the microlens material resulting from microlens structures affecting microlens material flow behavior during heating; (5) the effects of pre-heating or pre-flow treatment of frame or microlens materials; (6) the desired approximate radius of the microlens structure after heating of the microlens material is completed; and (7) the effects of a base layer within microlens material that alters flow properties of the microlens material.

Pre-flow treatment of frame or microlens materials can include UV exposure which cross-links the material resulting in less flow and better shape retention of "as printed" microlens shapes. Reflow properties of microlens materials, frames structures receiving microlens material and microlens base layers embedded in microlens material are determined by, among other things, initial polymer material properties of microlens material, frame opening structures and/or microlens base layers. Also, temperature profile over time for reflow, pre-flow treatment of material and pre-bake of microlens, frame or layer materials (or a combination thereof) at temperatures below glass transition temperatures for a specified time that tends to harden a material so treated. Ultraviolet (UV) or light exposure before reflow can affect the viscosity of microlens material or frame material during flow reflow processing. Pre-baking results in less reflow and better "as printed" shape retention of microlens material, material which frame openings are formed into (e.g., planar layer 1) or both. Determination of design parameters can be done by a cycle of selecting of a set of design parameters, producing a lens structure with the design parameters and evaluating resulting lens structure to determine if the resulting lens structure meets design requirements as will be further described below.

Figure 3:
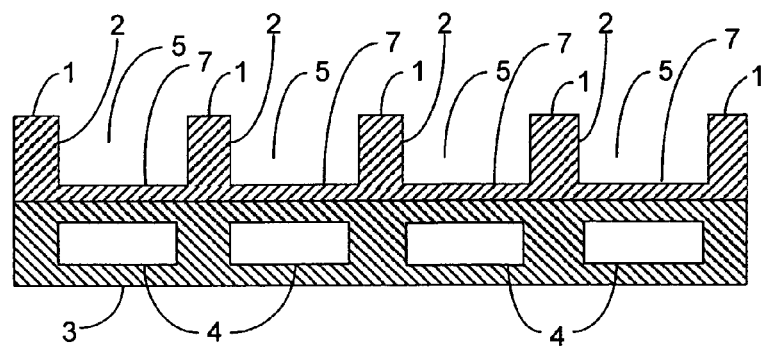
FIG. 3 shows a simplified perspective view of a portion of a microlens structure constructed in accordance with an exemplary embodiment of the invention.
Figure 3A:
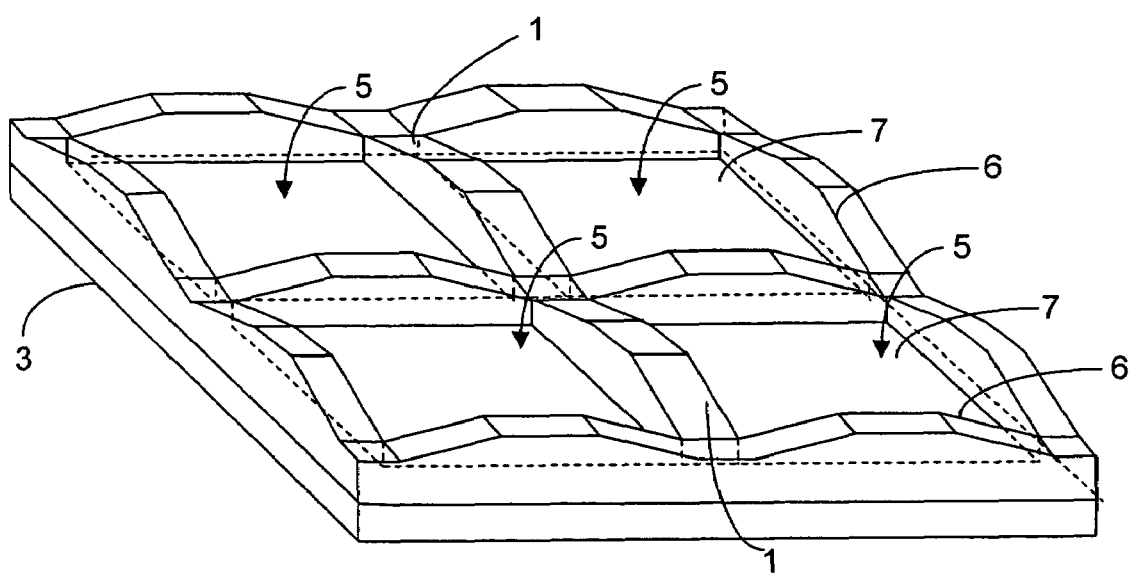
FIG. 3A shows a perspective view of several FIG. 3 microlens structures defined within a substrate.

FIG. 3 shows a perspective view of a simplified frame opening 5 with exemplary sidewalls 6 enclosing the frame opening 5 and a floor portion 7, such as those shown in FIGS. 1-2. FIG. 3 shows how frame sidewalls 6 can have laterally sloping sides, which have a higher portion in the middle of the sidewalls 6 and another portion that slopes downward from a portion approximately mid-way from a center portion toward an end segment of the sidewalls 6. The FIG. 3 sidewalls 6 have a downward sloping height from a top section of the sidewall 6 to the end of the sidewall 6 on both ends in a symmetrical fashion. The sidewalls 6 have a sidewall height which is at a maximum height in a center portion and a minimum height at both end portions of the sidewalls 2. FIG. 3A shows an expanded perspective view of the FIG. 1 and FIG. 3 exemplary embodiments with more than one frame opening 5. Each frame opening 5 is defined by sidewalls 6 and frame opening floor 7 within the planar layer 1.

Frame opening 5 depths can also be varied from one point of a floor of the frame opening 5 to another portion of the floor in the opening 5 thereby causing a portion of a flowed microlens within the opening 5 to be tilted, flattened or raised with respect to other portions of the flowed microlens.

Figure 3B:
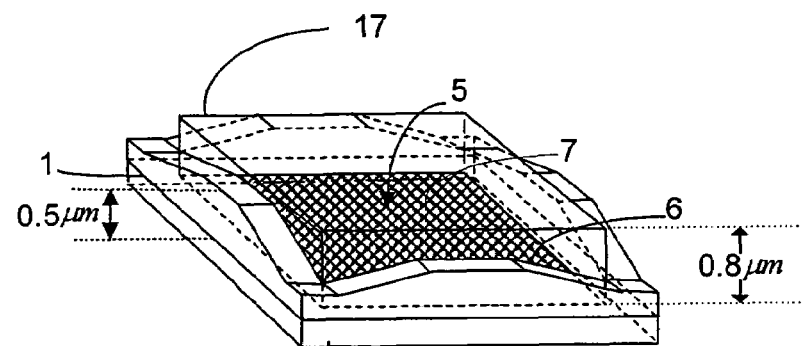
FIG. 3B shows a perspective view of a FIG. 3 microlens structure with lens material before heating within a frame defined within a substrate.
Figure 3C:
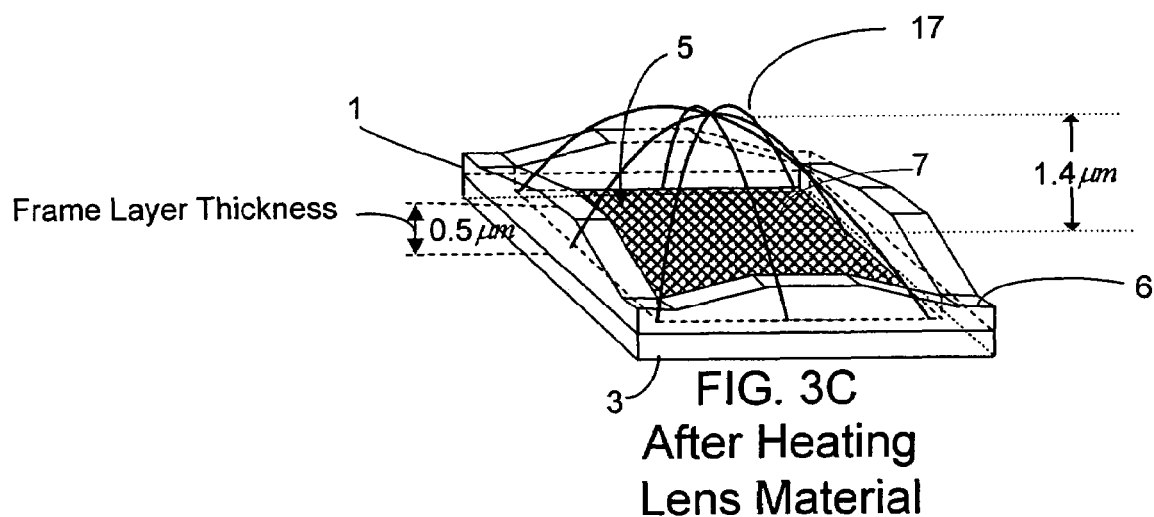
FIG. 3C shows a perspective view of a FIG. 3 microlens structure with lens material after heating within a frame defined within a substrate.

Both positive and negative lens structures can be produced with frame or other structures described herein that affect formation of lens structures during fabrication. For example, FIG. 3B shows a frame structure formed by coating a substrate 3 with positive resist 17 to form a frame with a varying sidewall 6 thickness of about 0.5 μm to about 0.25 μm, as measured from a floor portion to a top portion of frame opening 5. A deposited microlens layer 17 has a thickness within the frame opening 5 of about 0.8 μm before reflow. In the FIG. 3B embodiment, frame sidewalls 6 have a sloping end portion that slopes down to a corner area of the frame. FIG. 3C shows the FIG. 3B structure after reflow of the deposited microlens layer 17, wherein the microlens layer melts and flows such that it assumes a shape of about 1.4 μm at a center portion and a width of about 3.12 μm. The height of the resulting flowed microlens layer 17 in FIG. 3C is higher than it would be without the frame structure. In such a manner, microlenses can be formed with a radius independent of the microlens' size (e.g., height).

Figure 13:
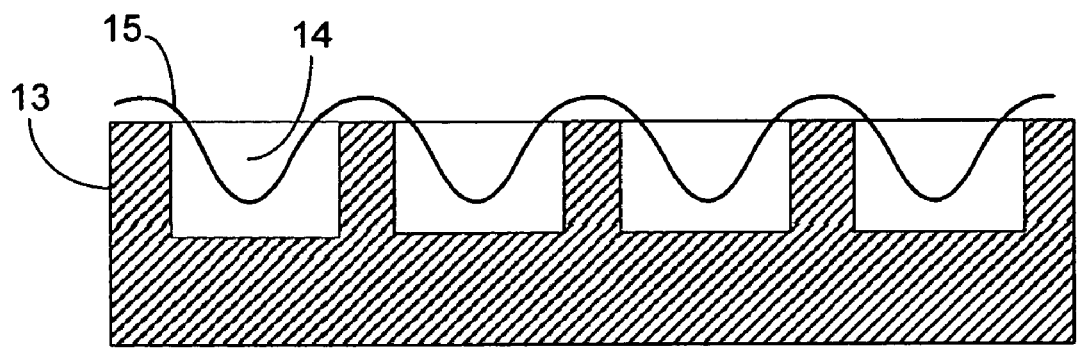
FIG. 13 shows a cross sectional view of a portion of a microlens structure constructed in accordance with an exemplary embodiment of the invention.
Figure 14:
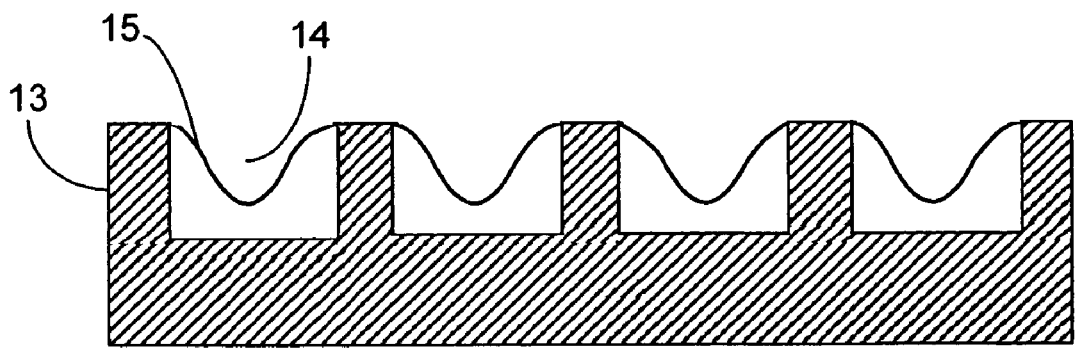
FIG. 14 shows a cross sectional view of a portion of a microlens structure constructed in accordance with an exemplary embodiment of the invention.

A negative microlens, such as shown in FIGS. 13-14, can have a frame layer thickness of about 1.4 μm at a center portion and microlens layer thickness of about 0.8 μm before reflow (about 0.7 μm after reflow with a radius of about −3.8

μm below the frame and from a center point above the microlens' concave shaped curvature). Forces including surface tension from surfaces including the sidewalls and floor as well as gravity in this example cause the melting photoresist to reflow to a volume that is semi-spherically shaped. Surface tension and gravity have a similar effect on flowing photoresist as is found when a droplet of water forms on a flat portion of a table or in a dip/sink portion in the table. Negative microlens are further discussed below.

Frame opening and microlens material design parameters are determined by fabrication of microlenses within frame openings with different design parameters and then evaluating the resulting effects of altering design parameters. Empirical test data obtained from the evaluation is used to determine the shape, dimensions, material selection and flow/reflow time as well as other fabrication or design parameters used to fabricate a microlens in accordance with the invention. Changes in design parameters result in different flow or reflow of microlens materials. Accordingly, varying design parameters to affect a balance between surface and volume forces affecting flow or reflow behavior of a microlens material during heating results in different microlens shapes, radius and/or heights after flowing or reflowing.

Figure 4:
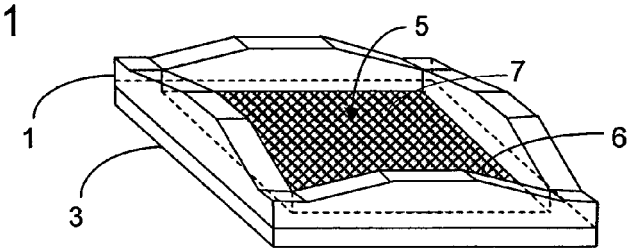
FIG. 4 shows a portion of a microlens structure constructed in accordance with an exemplary embodiment of the invention.
Figure 5:
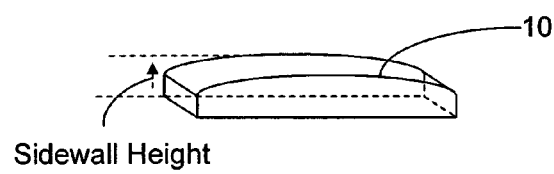
FIG. 5 shows a portion of a microlens structure constructed in accordance with an exemplary embodiment of the invention.

Frame openings 5 can be designed with a variety of sidewalls (e.g., sidewall 2, FIG. 1) having different profiles that affect the microlens material deposited and flowed within the frame opening 5. FIGS. 3-5 show examples of different sidewalls for a lens structure frame enclosure, e.g., sidewalls 6, 8, 10 that can be used to define different exemplary frame openings (e.g., frame opening 5) used to affect the flow of microlens material.

FIG. 4 shows another exemplary sidewall 8 that has a non-uniform or asymmetrical height profile across one portion of its length, but not the remaining portion. The FIG. 4 sidewall 8 defines a frame opening in a manner, for example, as shown in FIG. 3A. The FIG. 4 sidewall 8 has one end that is depressed as contrasted to the other end which is not. Other shapes can be used to adjust flow behavior of lens material including other asymmetrically shaped sidewalls or containing structures of lens material.

FIG. 5 shows another exemplary sidewall 10 that has two symmetrically shaped top portions, which begin and slope downward gradually from a center point of the sidewall to an opposing end segment of the sidewall 10. A different sidewall shape will affect the shape and radius of a microlens formed on or within the opening defined by the particular sidewall.

In addition, frame opening sidewalls (e.g., sidewalls 2, 6, 8, 10) can be symmetrical or asymmetrical with respect to opposing sides of a sidewall. In other words, a sidewall can be formed with different or irregular shaped end portions. Frame opening sides, e.g., symmetrical sides can have a side which is not mirrored by an opposing side, such as if one sidewall is lower than an opposing sidewall.

For thin microlens films, depths of the frame opening 5 can also be varied from one point of a floor of the frame opening 5 to another portion of the floor, thereby causing a portion of a flowed microlens within the opening 5 to be tilted, flattened or raised with respect to other portions of the flowed microlens. Also, non-symmetrical microlenses can provide focal points that are not directly underneath a microlens if needed for a particular design.

Figure 9:
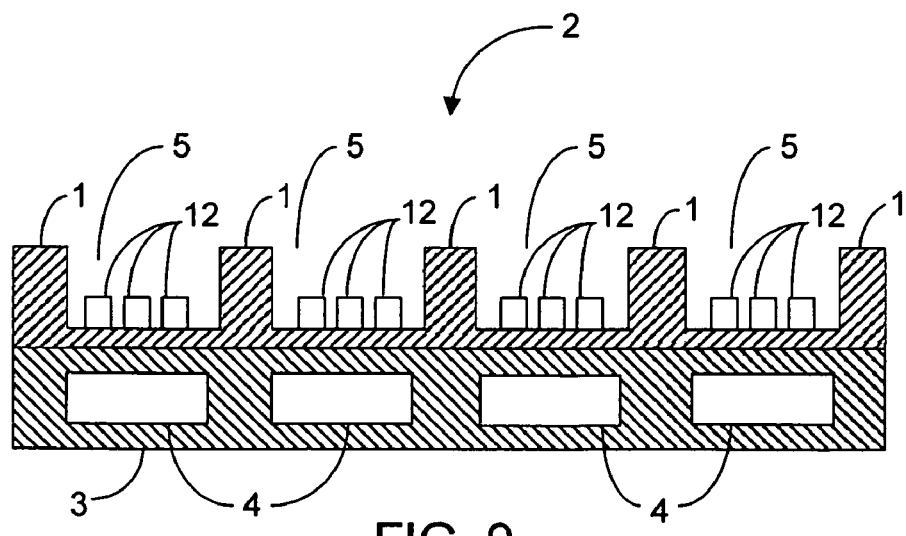
FIG. 9 shows a cross sectional view of a portion of an imager structure constructed in accordance with an exemplary embodiment of the invention.
Figure 8A:
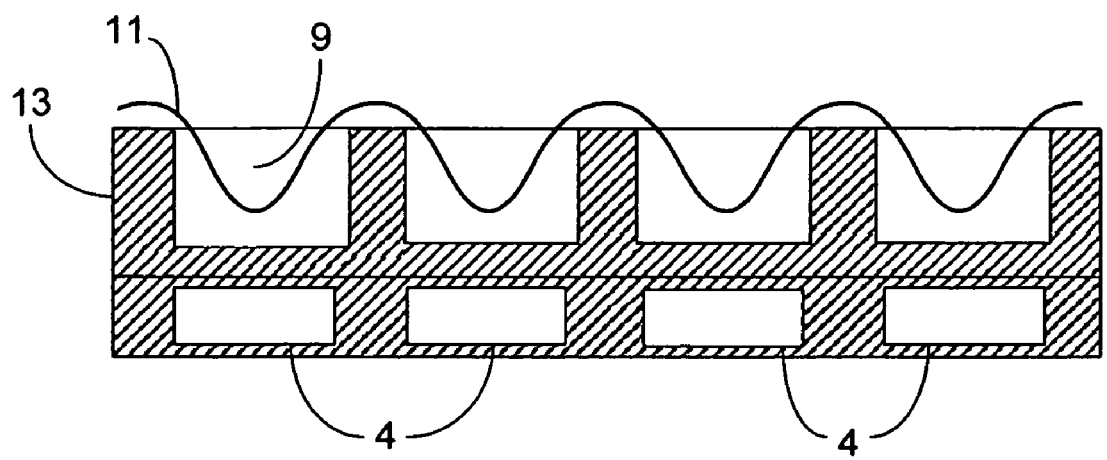
FIG. 8A shows a cross sectional view of a portion of an imager structure with a negative microlens constructed in accordance with an exemplary embodiment of the invention.
Figure 8B:
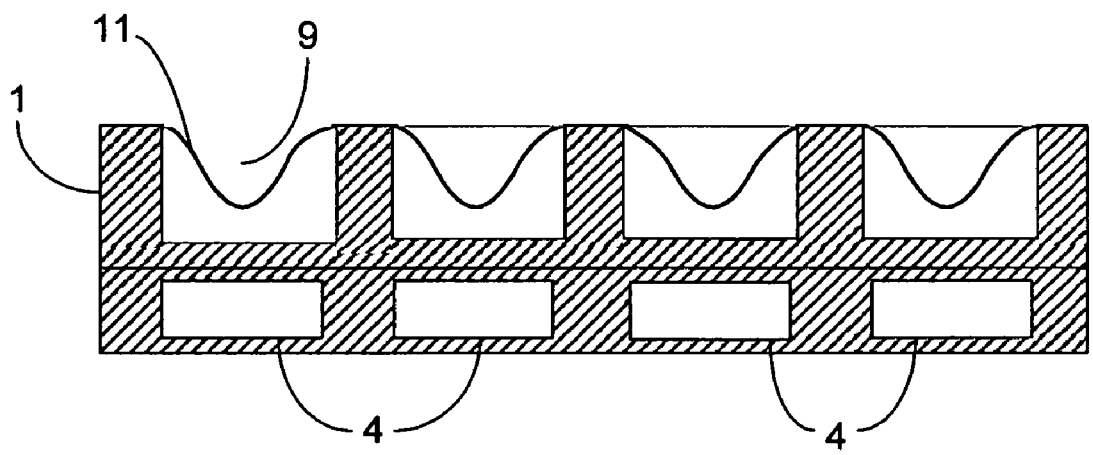
FIG. 8B shows a cross sectional view of a portion of a FIG. 8A imager structure with a negative microlens after heating constructed in accordance with an exemplary embodiment of the invention.
Figure 8C:
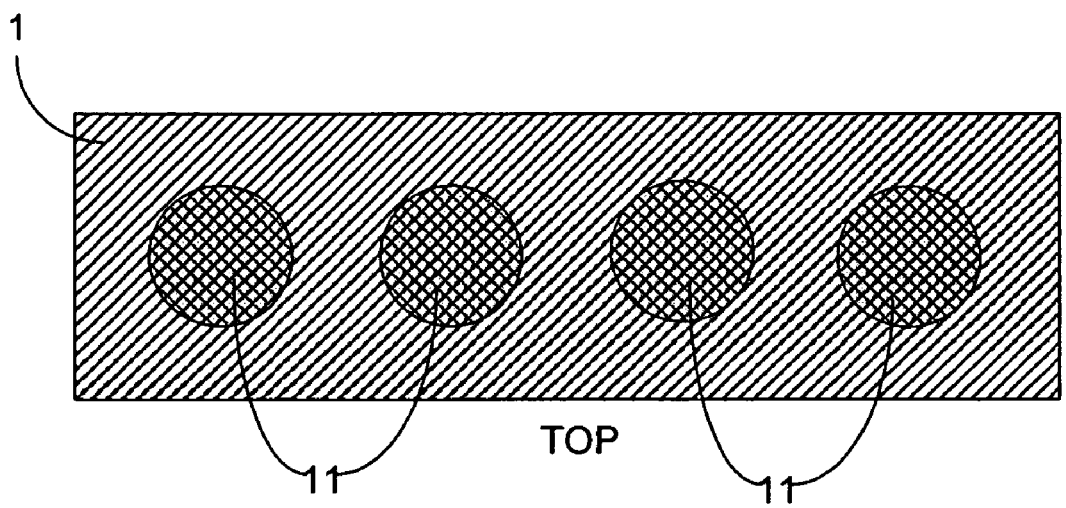
FIG. 8C shows a top view of the FIGS. 8A and 8B imager structures constructed in accordance with an exemplary embodiment of the invention.
Figure 18:
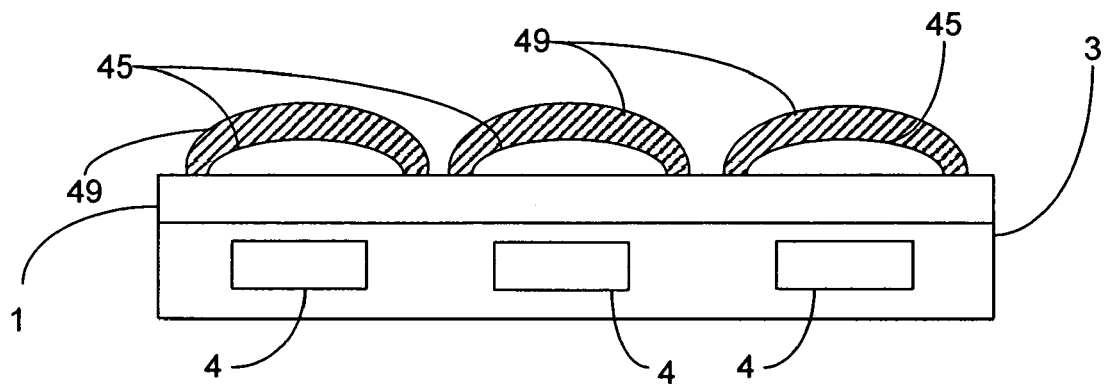
FIG. 18 shows a cross sectional view of a portion of an imager structure constructed in accordance with an exemplary embodiment of the invention.

A frame sidewall (e.g., FIGS. 1-5) can be further designed based on a three-dimensional model of the effects of varying multiple microlens structure design parameters including frame opening (e.g., opening 5) or volume affecting structures (e.g., FIG. 9, protrusion 12; FIG. 18, layer 45) in order to design a frame opening volume, floor and sidewalls that suitably alter microlens material flow behavior towards a desired microlens shape. A three-dimensional profile of a frame opening 5 can be designed based on design layout as well as adjusting photolithography tool characteristics. For example, three-dimensional profiles can be obtained as the result of a limited resolution of a photolithography tool and process used to print or form the frame openings 5. A rounded shape or sloped wall of a frame opening 5 can be obtained by exceeding photolithography resolution limits so a mask produces less than a well defined print image during photolithography. A three-dimensional profile of a frame opening 5 can be designed to alter multiple aspects of a microlens shape or optical properties such as focal characteristics (e.g., focal length) and focal point. Three-dimensional modeling and designs for microlenses can be produced by use of commercial and proprietary optical property modeling tools that simulate optical characteristics of microlenses, such as Lighttools®. Other tools are available to provide modeling of flow/reflow behavior of microlenses during heating processing. Together, the tools can be used to predict how different three-dimensional designs of frame openings, as well as other structures affecting microlens material flow, alter microlens shapes and optical properties.

Figure 6:
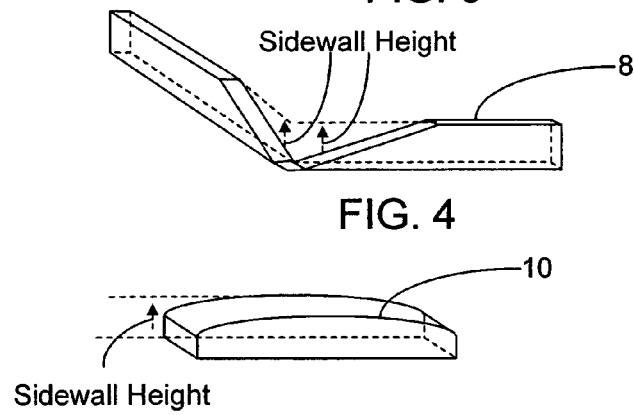
FIGS. 6 and 6A show top views of a portion of an imager structure constructed in accordance with an exemplary embodiment of the invention.
Figure 6A:
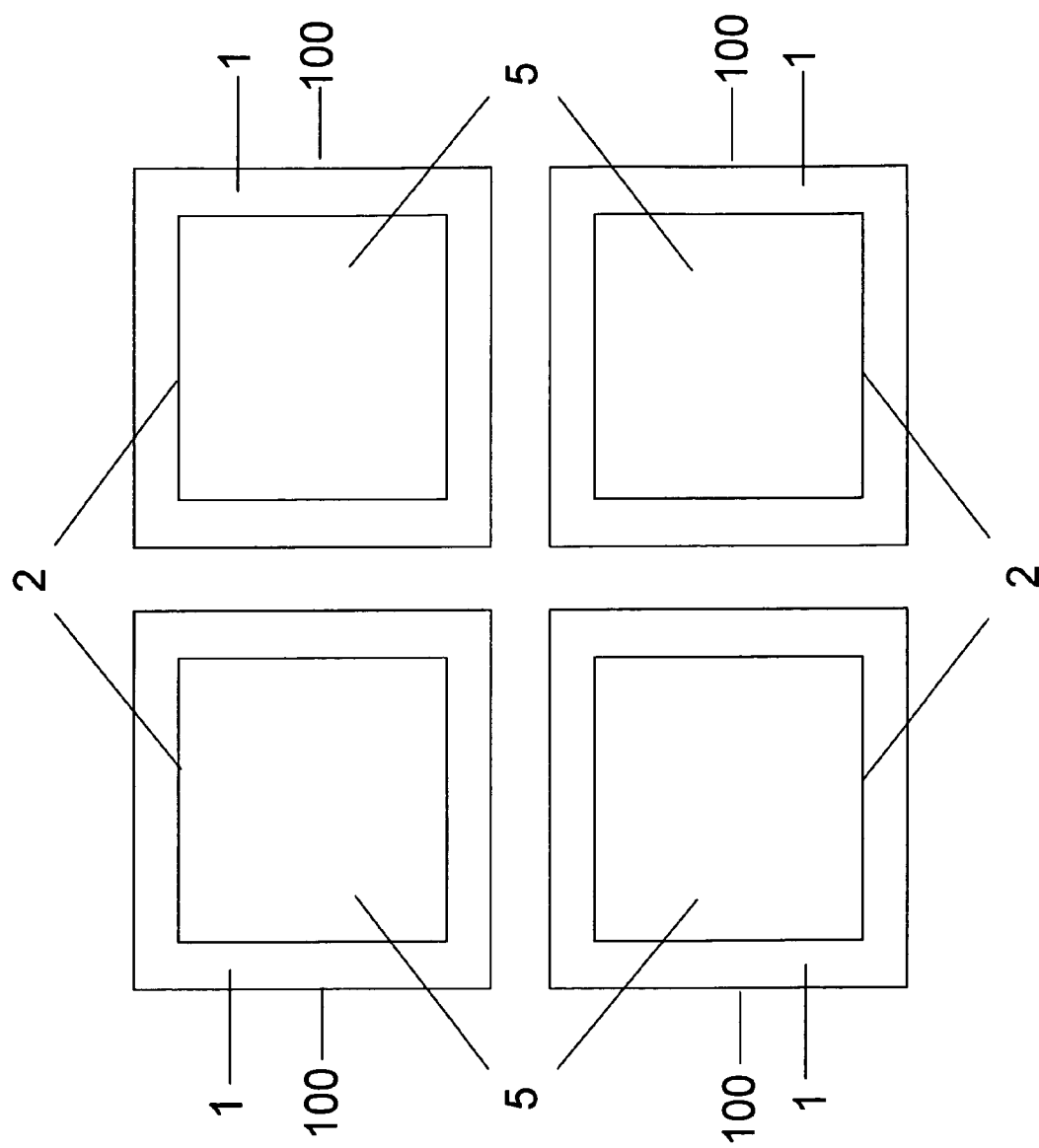

FIGS. 6 and 6A show top views of the FIG. 1 imager with substantially rectangular frame openings 5 defined by frame opening sidewalls 2 defined within planar layer 1 formed on a substrate with an image pixel underneath the frame opening 5 (not shown). FIG. 6A shows each of the frames 100 not in contact with other of the frames 100. An alternative embodiment will have other shapes including circular shaped (e.g., frame openings 5 of FIG. 8).

Figure 7:
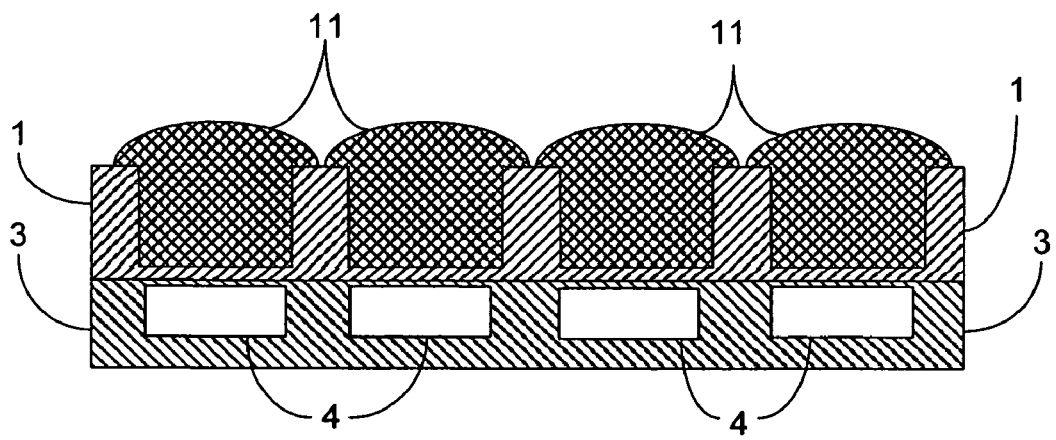
FIG. 7 shows a cross sectional view of a portion of an imager structure constructed in accordance with an exemplary embodiment of the invention.

FIG. 7 shows a cross-sectional view of the FIG. 1 imager structure after microlens material is deposited and flowed/reflowed into the frame openings 5. The illustrated microlenses 11 have been formed as positive microlenses 11 by overfilling the frame openings 5 with microlens material. However, a negative microlens can be formed by depositing less microlens material before the flowing process, such as is shown in FIGS. 8A-8C, 13 and 14. It should be noted that the second coat in FIGS. 8A-8C can be uniform as shown or imaged into patters to achieve a desired shape after reflow.

Figure 8:
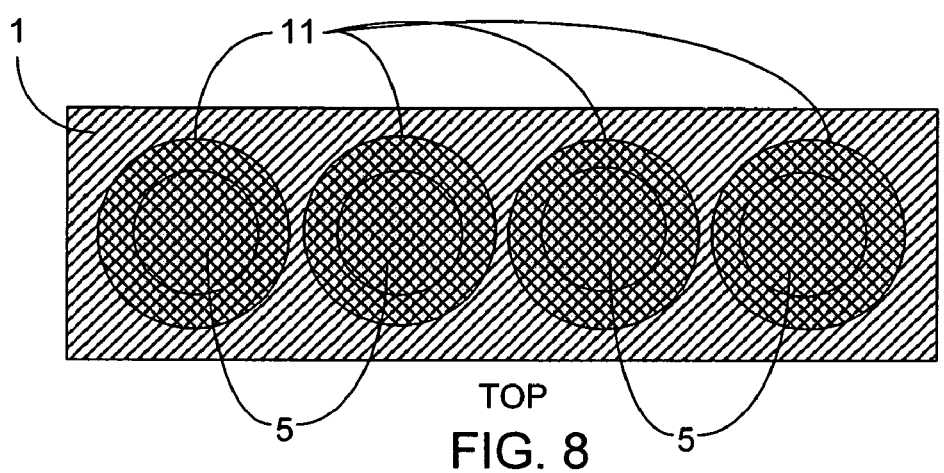
FIG. 8 shows a top view of a portion of an imager structure constructed in accordance with an exemplary embodiment of the invention.

FIG. 8 shows a top view of the FIG. 7 structure. Microlens material is deposited within and above frame openings 5 such that when the microlens material is heated, a positive microlens 11 having an approximate convex upper shape is formed. FIG. 8 shows circular shaped microlenses 11 with an upper portion that is above planar layer 1 and having a larger diameter than frame openings 5 after microlens material has been deposited into frame openings 5 and the microlens material flowed/reflowed.

Figure 10:
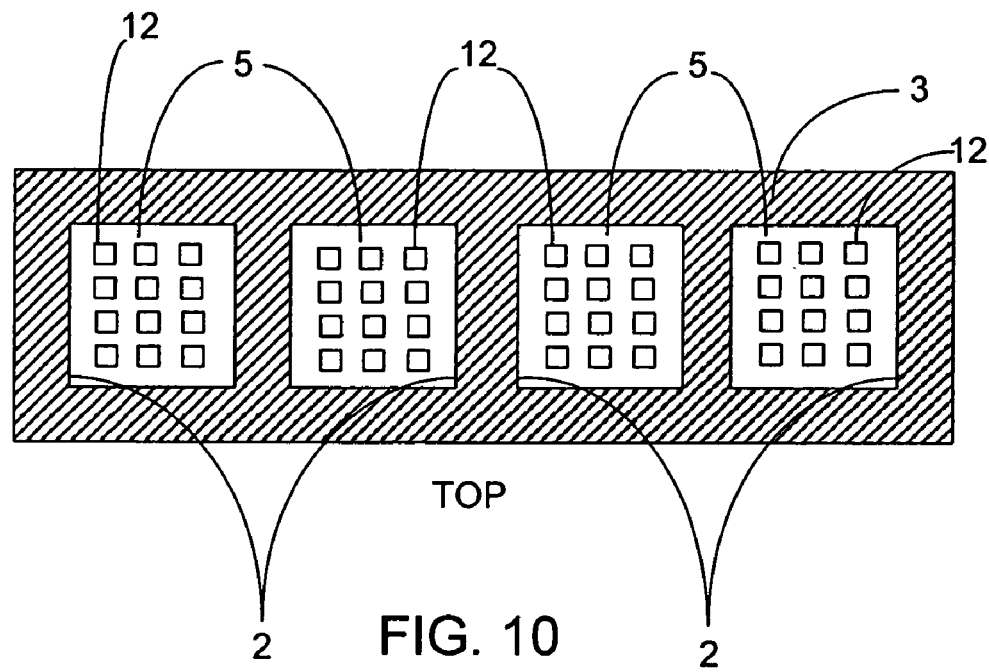
FIG. 10 shows a top view of a portion of an imager structure constructed in accordance with an exemplary embodiment of the invention.
Figure 11:
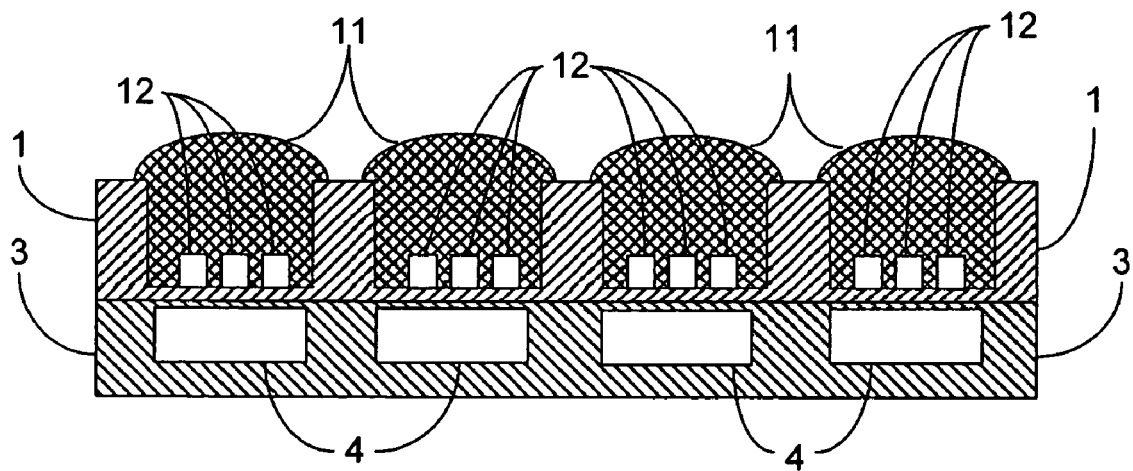
FIG. 11 shows a cross sectional view of a portion of an imager structure constructed in accordance with an exemplary embodiment of the invention.

Another exemplary embodiment of the invention is shown in FIGS. 9-11 where base layers 12 (FIG. 9) are formed on a floor portion of the frame opening 5. FIG. 10 shows a top view of the FIG. 9 exemplary embodiment with the base layers 12 formed as a pattern of protrusions on the floor of the frame opening 5. The base layers 12 and sidewalls 2 have the effect of cooperatively changing flow properties of the microlens material. Referring to FIG. 11, microlens material is formed over the base layers 12 and then heated to flow the microlens material into a desired microlens 11. Shape, materials and dimensions of base layers 12 and frame openings are determined based on design parameters including effects on deposited microlenses forming around and over protrusions in frame openings 5 and those described above for the FIGS. 1-8. Base layers 12 can be formed from the planar layer 1 or by depositing additional layers on the floor of the frame opening (e.g., frame 5). A three-dimensional profile of the frame opening 5 can be made to include effects of both base layer 12 and frame opening 5 along with other design factors such as photolithographic processing characteristics.

Figure 12:
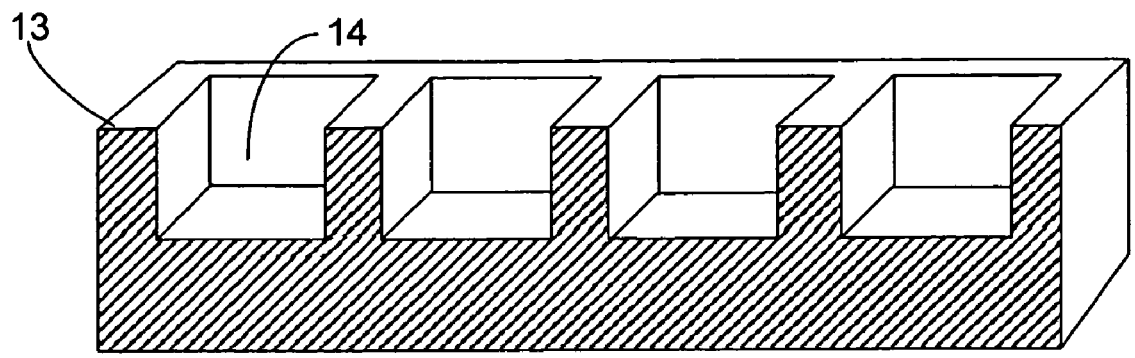
FIG. 12 shows a perspective cross sectional view of a portion of a microlens structure constructed in accordance with an exemplary embodiment of the invention.

FIGS. 12-14 show an exemplary embodiment of the invention used to form negative microlenses. FIG. 12 shows a perspective view of a portion of an imager structure having substrate 13 with frame openings 14. FIG. 13 shows microlens material 15 that has been deposited into the frame openings 14. The microlens material 15 has been underfilled into frame openings 14. FIG. 14 shows microlens material 15 after heating and flowing which resulted in a negative (concave) microlens.

Figure 15:
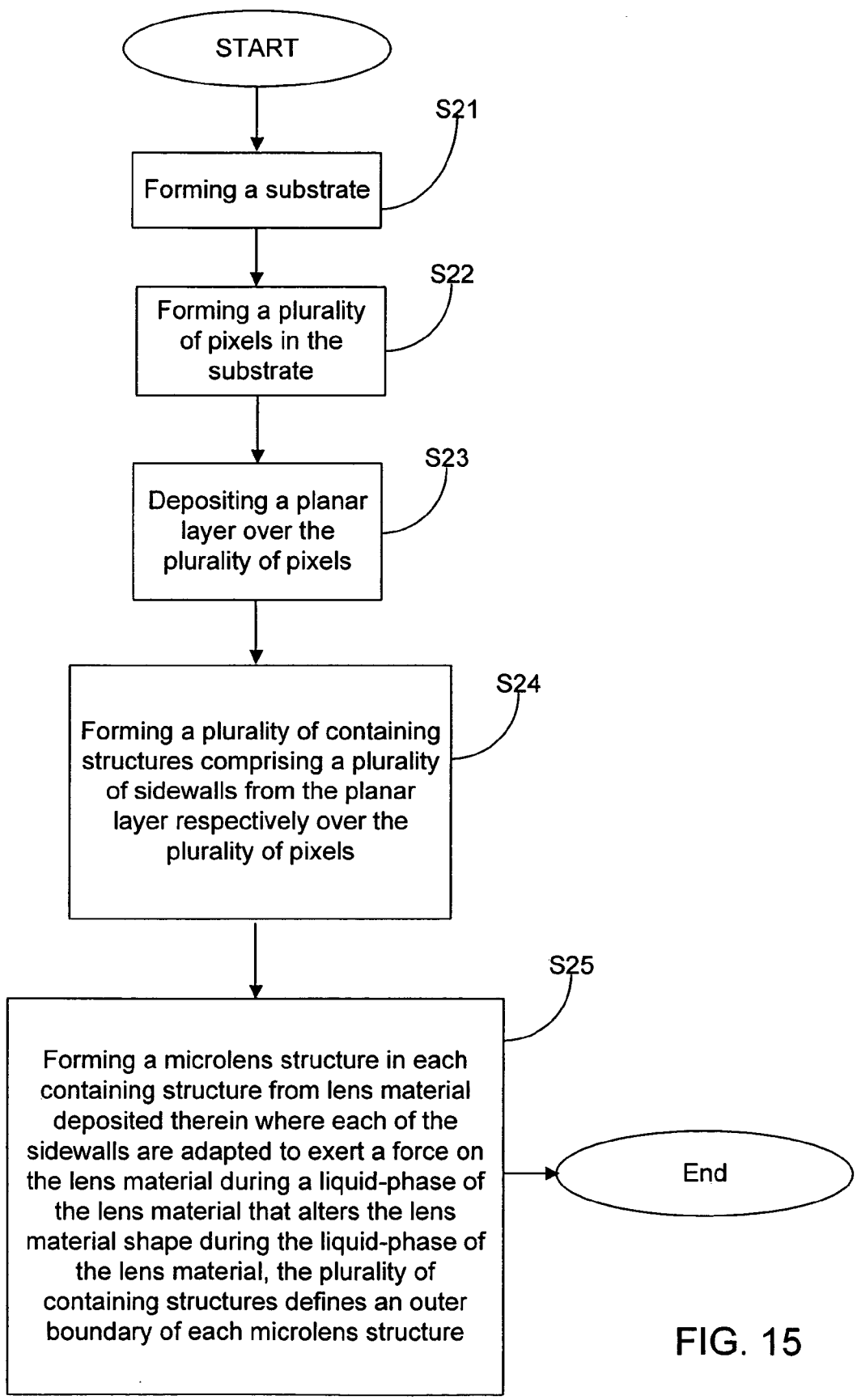
FIG. 15 shows a method of manufacturing an microlens structure in accordance with an exemplary embodiment of the invention.

An exemplary process for manufacturing an exemplary embodiment of the invention, such as the ones shown in FIGS. 1-8, is shown in FIG. 15. At processing segment S21, a substrate is formed or provided. At processing segment S22, a plurality of pixels are formed in the substrate. At processing segment S23, a planar layer is deposited over the plurality of pixels. At processing segment S24, a plurality of containing structures are formed from the planar layer comprising a plurality of sidewalls respectively formed over the plurality of pixels, the plurality of containing structures defines an outer boundary of the microlens structure. At processing segment S25, a microlens structure is formed in each containing structure from lens material deposited therein where each of the sidewalls are adapted to exert a force on the lens material during a liquid-phase of the lens material that alters the lens material shape during the liquid-phase of the lens material.

Figure 16:
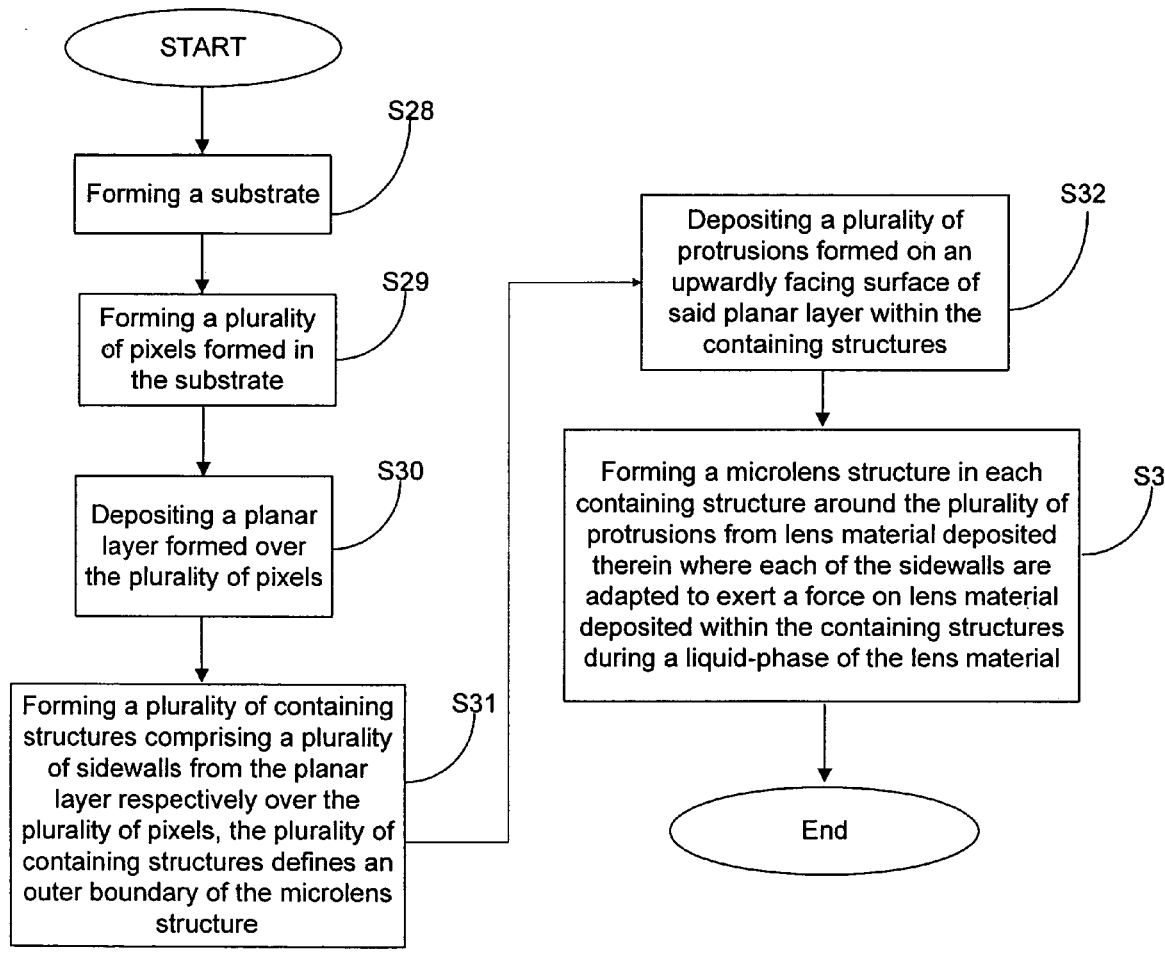
FIG. 16 shows a method of manufacturing an microlens structure in accordance with an exemplary embodiment of the invention.

An exemplary process for manufacturing another exemplary embodiment of the invention, such as the ones shown in FIGS. 9-11, is shown in FIG. 16. At processing segment S28, a substrate 3 is formed. At processing segment S29, a plurality of pixels 4 are formed in the substrate 3. At processing segment S30, a planar layer 1 is formed over the pixels 4. At processing segment S31, a plurality of containing structures are formed respectively over the plurality of pixels. Each of the plurality of containing structures is formed with a plurality of sidewalls formed from the planar layer such that the plurality of containing structures defines an outer boundary of the microlens structure. At processing segment S32, a plurality of protrusions are formed on an upwardly facing surface of the planar layer within each of the enclosures. At processing segment S33, a microlens structure is formed within each containing structure from lens material deposited therein where each of the sidewalls are adapted to exert a force on lens material deposited within the containing structures during a liquid-phase of the lens material.

Figure 17:
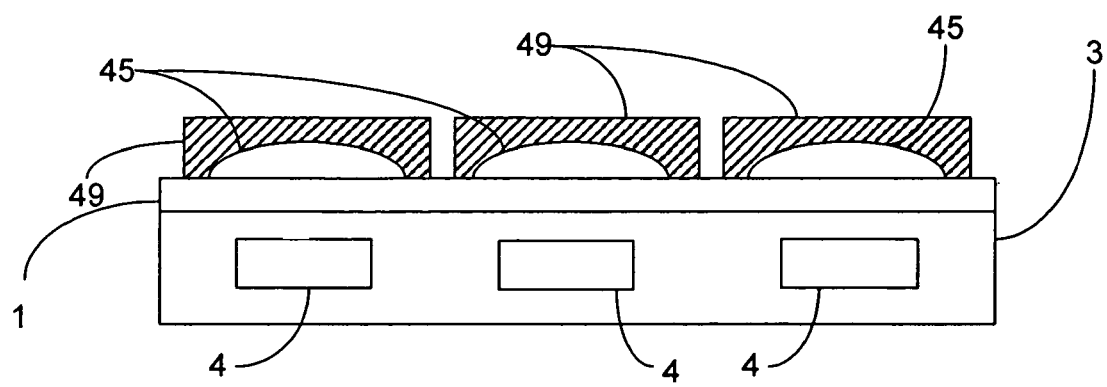
FIG. 17 shows a cross sectional view of a portion of an imager structure constructed in accordance with an exemplary embodiment of the invention.

FIG. 17 shows microlens structures formed over imager pixels in accordance with another exemplary embodiment of the invention. Microlens base layers 45, convex shaped in this embodiment, are formed on a planar layer 1 over pixels 4. Microlens material 49 is formed over the microlens base layers 45. The microlens base layer 45 and microlens material 49 dimensions, shape and volume are determined by a number of design parameters including those described with respect to FIGS. 1-8 above. The design parameters of microlens base layer 45 and microlens material 49 are determined by the fabrication of microlenses with embedded microlens base layers 45 having different design parameters and then evaluating the resulting effects of altering design parameters from one design to another. As with the FIGS. 1-8 exemplary embodiments, empirical test data obtained from the evaluation is then used to determine the shape, dimensions, material selection and flow/reflow time as well as other fabrication or design parameters used to fabricate a microlens in accordance with the invention.

FIG. 18 shows the FIG. 17 lens structures after the flowing of microlens material 49. Microlens material 49 has been flowed into a shape, in this case a convex shaped lens 49, that is determined in part by the shape, viscosity, dimensions and volume of microlens base layer 45.

Figure 19:
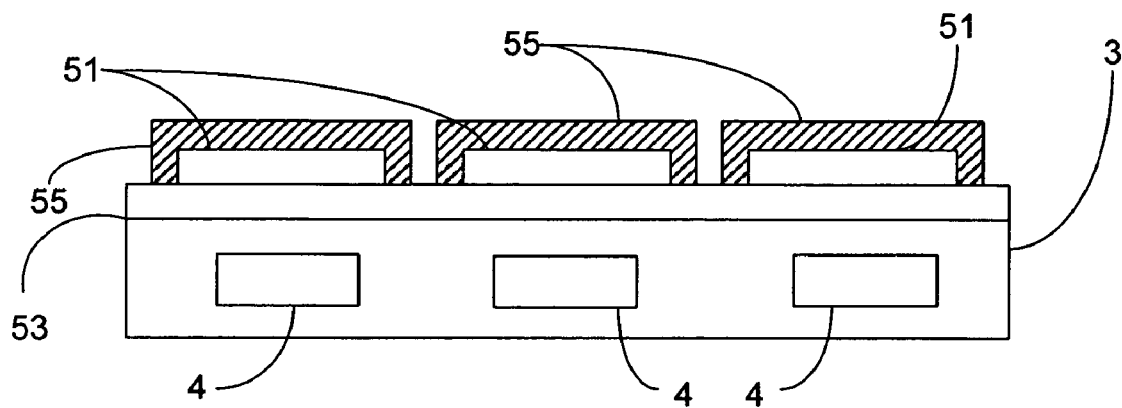
FIG. 19 shows a cross sectional view of a portion of an imager structure constructed in accordance with an exemplary embodiment of the invention.

FIG. 19 shows an imager in accordance with another exemplary embodiment of the invention. A squared microlens base layer 51 is formed on a planarized substrate 53 having photosensitive photosensors 4 formed therein. A microlens material 55 is formed over and around the microlens base layers 51. The microlens base layer 51 and microlens materials' 55 size, shape and volume are determined based on design parameters including volume and flow parameters as well as design parameters discussed with respect to the FIG. 14 microlens base layers 51.

Figure 20:
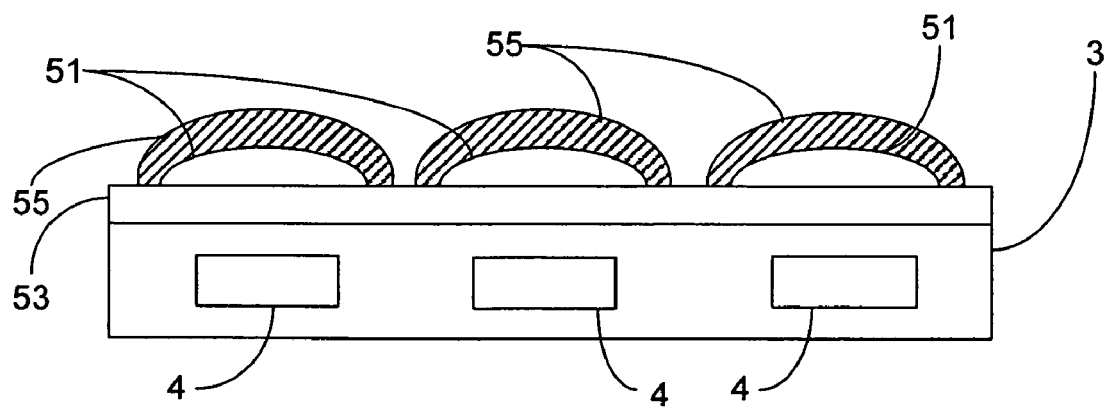
FIG. 20 shows a cross sectional view of a portion of an imager structure constructed in accordance with an exemplary embodiment of the invention.

FIG. 20 shows the FIG. 19 imager after the microlens material 55 has been shaped through processes such as flowing. Microlens material 55 and microlens base layer 51 are both affected by each other during flowing of lens material 55, lens base layer 51 or both.

Three-dimensional designs of the structures illustrated in FIGS. 17-20 can also be designed using principles and design parameters discussed above. Lens base layers 45 and microlens material 49 can be formed which alter flow or reflow behavior of microlens material 49 by exerting forces on the liquid-phase lens material to shape of liquid-phase lens material during flowing of lens material to produce a desired microlens shape.

Figure 21:
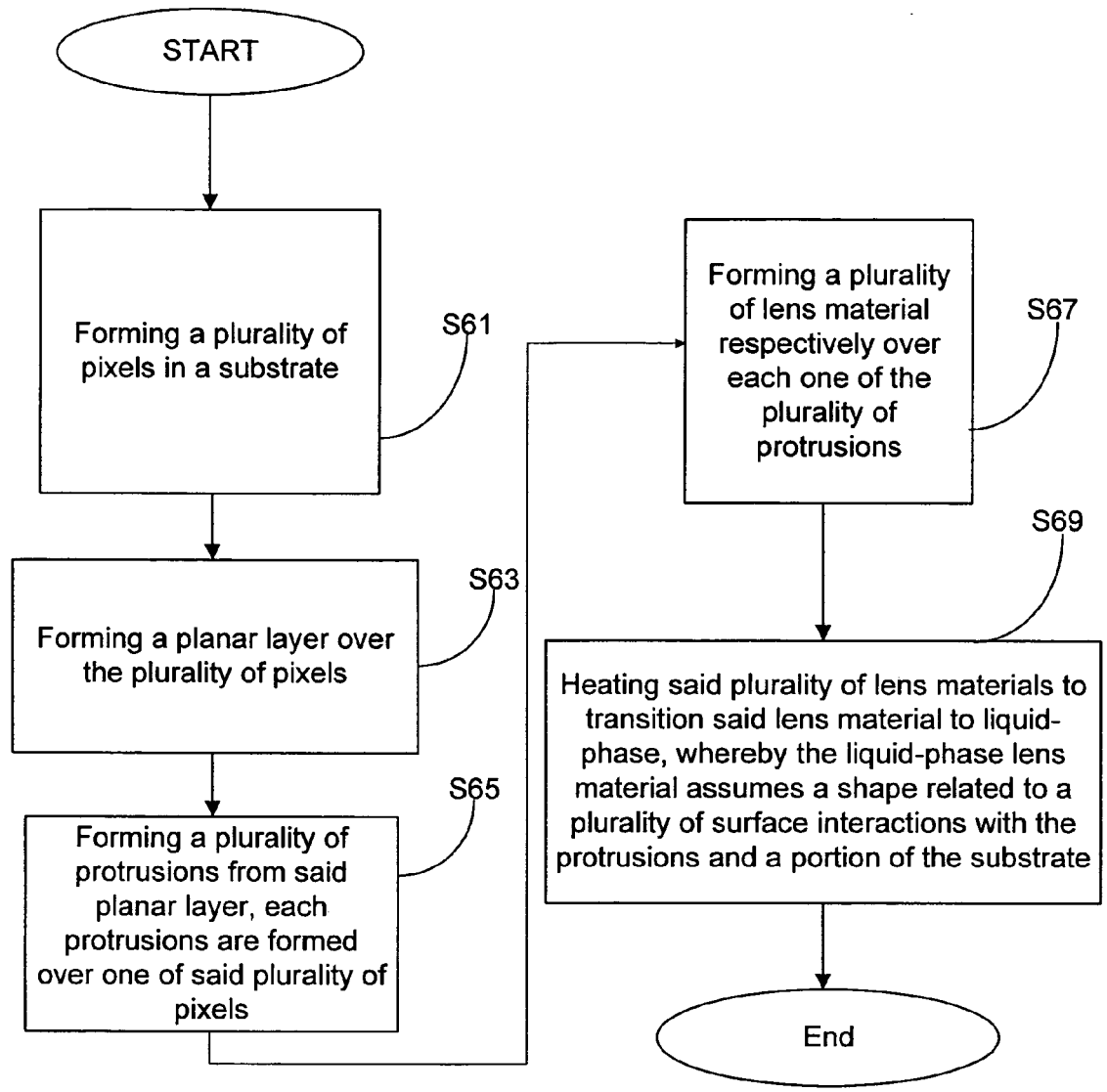
FIG. 21 shows a method of manufacturing an microlens structure in accordance with an exemplary embodiment of the invention.

FIG. 21 shows a method of forming an imager structure in accordance with another exemplary embodiment of the invention. At processing segment S61, a plurality of pixels are formed in a substrate. At processing segment S63, a planar layer is formed over the pixels and the substrate. At processing segment S65, a plurality of protrusions are formed from the planar layer, each of the protrusions are formed over one of the plurality of pixels. At processing segment S67, a plurality of lens material is formed over and around each of the protrusions. At processing segment S69, the lens material is heated to transition the lens material to a liquid-phase, each of the plurality of liquid-phase lens materials assumes a shape related to a geometric shape of the protrusion embedded in the liquid-phase material as well as a plurality of surface interactions with an embedded protrusion and planar layer. The plurality of surface interactions include a surface tension force, an effect of a change in volume on said liquid-phase lens material caused by a presence of one of said plurality of protrusions within each of said plurality of liquid-phase lens materials, an adhesive force with said protrusions and a gravitational force. The protrusions can be formed as rectangular protrusions extending vertically from the planar surface.

Microlens base layer and microlens layer shape and volume are determined such that the combination thereof determines one or more final dimensions and one or more optical properties of the microlens layer respectively formed over the underlying base layers. The microlens layers can be rectangular or circular shaped microlens layers. Additional blocks or protrusions can be formed above the microlens base layers or the microlens base layer can be formed into separate smaller blocks or protrusions. The microlens base layers and microlens layers dimensions, shape and materials determination are based in part on microlens layer flow properties and desired microlens layer optical properties after formation.

Figure 22:
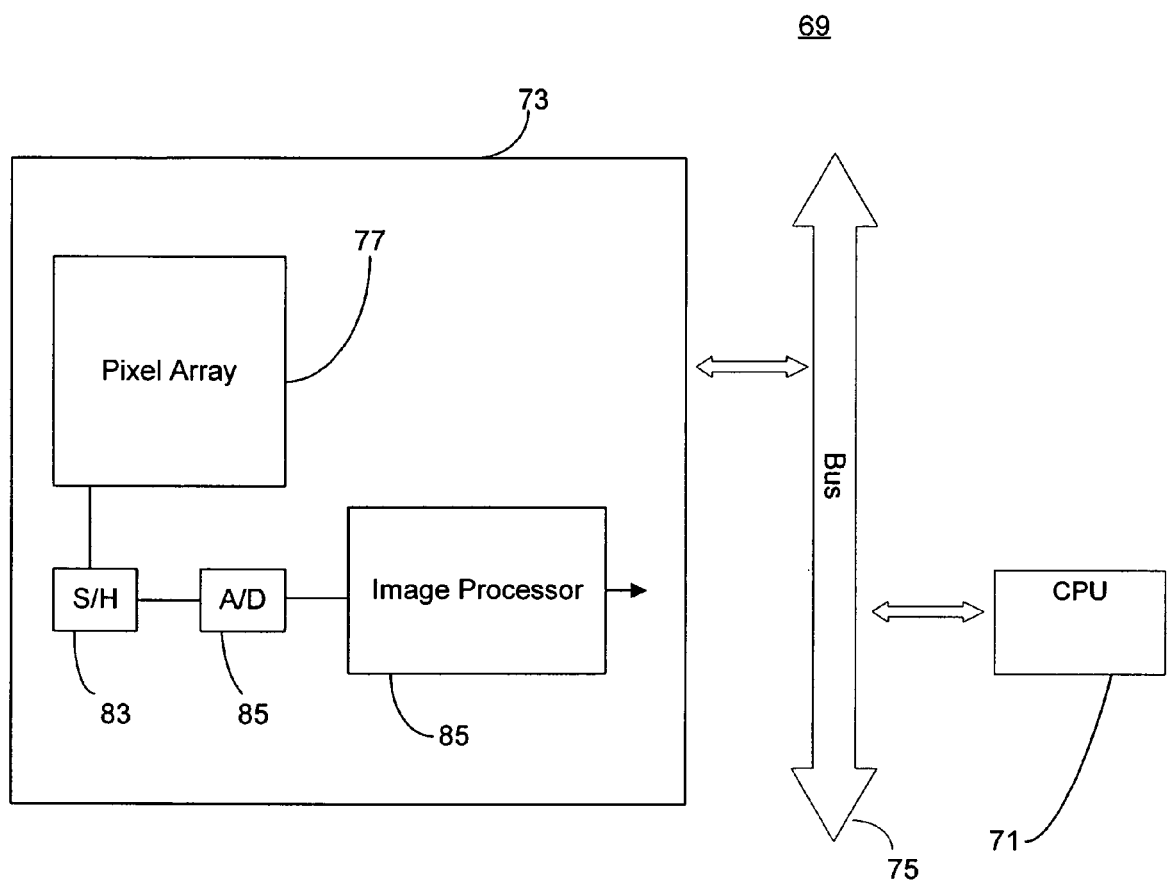
FIG. 22 shows an image processing system constructed in accordance with an exemplary embodiment of the invention.

The apparatus and process for manufacturing an apparatus aspects of the invention can be used to construct a system 69 shown in FIG. 22. An imager 73 with a pixel array 77 comprising a microlens structure in accordance with any of the embodiments of the invention is coupled with a sample and hold circuit 83. An analog to digital (A/D) 85 is receives signals from the sample and hold circuit 83 and outputs digital signals to an image processor 85. The imager 71 then outputs image data to a data bus 75. A central processing unit coupled to the data bus 75 receives image data.

It should be noted that the structures shown in the figures show both rounded sidewalls (e.g., FIG. 1A, sidewall 1) as well as squared or non-rounded sidewalls (e.g., FIG. 1, sidewall 1). A person skilled in the art would recognize that a variety of sidewall shapes are capable of being used with different embodiments of the invention.

It is also possible to form a microlens layer relative to a frame layer to allow additional influences, such as a non-equilibrium based design parameter, on a final shape of the completed microlens. For example, a microlens can be formed based on non-equilibrium flow conditions such as heating a lens material such that it begins a phase change to a liquid and begins flowing, then allow the lens material to solidify during the flow process before it reaches its final equilibrium shape as defined by surface and volume forces. Such non-equilibrium based design influences provide additional means for defining a final shape of a microlens.

Frame material can be transparent with a certain refractive index to help guide incident light onto a microlens. Frame material can also be absorbing to act as a black matrix outer containment layer. Transparent material or light absorbing material embodiments would aid in reducing crosstalk.

While exemplary embodiments of the invention have been described and illustrated, it should be apparent that many changes and modifications can be made without departing from the spirit or scope of the invention. Accordingly, the invention is not limited by the description above, but is only limited by the scope of the appended claims.

What is claimed as new and desired to be protected by Letters Patent of the United States is:

1. An imager structure comprising:
   a substrate;
   a plurality of pixels formed in said substrate;
   a planar layer formed over said plurality of pixels;
   a plurality of containing structures formed in said planar layer respectively over said plurality of pixels; and
   a lens material deposited in each of said plurality of containing structures, said lens material having a liquid phase and a solid phase, said plurality of containing structures define an outer boundary of said liquid phase lens material;
   wherein said plurality of containing structures include a plurality of sidewalls, each of said sidewalls being formed with a height that exerts a force on said lens material during the liquid-phase that alters said lens material shape, said lens material height after said lens material transitions to the solid-phase being dependent on at least one dimension of said sidewalls.

2. An imager structure as in claim 1, wherein said plurality of sidewalls are formed with an inwardly sloping inner sidewall surface.

3. An imager structure as in claim 1, wherein said plurality of sidewalls are formed with laterally sloping sidewalls.

4. An imager structure as in claim 1, wherein said plurality of sidewalls have a greater inward protrusion at a first point than another point.

5. An imager structure as in claim 4, wherein said first point is a lower portion of said sidewalls and said another point is a higher portion of said sidewalls.

6. An imager structure as in claim 1, wherein said sidewalls have a sloping end portion that slopes down to corner areas formed at intersection portions of said plurality of sidewalls.

7. An imager structure as in claim 1, wherein said sidewalls have a sloping end portion that slopes up from a center portion to corner areas formed at intersection portions of said plurality of sidewalls.

8. An imager structure as in claim 1, wherein said plurality of sidewalls have laterally sloping sides that have a higher portion in a middle portion of said plurality of sidewalls and another portion of said plurality of sidewalls that slopes downward from a portion about mid-way from said middle portion to an end section of each of said plurality of sidewalls.

9. An imager structure as in claim 1, wherein said sidewalls have an opening in said sidewalls sloping upward from a bottom center section of the sidewall to end portions of each said sidewall on both ends symmetrically.

10. An imager structure as in claim 1, wherein said sidewalls have a downward sloping height from a top section of the sidewall to an end portion of each said sidewall on both ends symmetrically.

11. An imager structure as in claim 1, wherein said sidewalls have a sidewall height which is at a maximum height in an end portion and a minimum height at center portion of the sidewalls.

12. An imager structure as in claim 1, wherein said sidewalls have a sidewall height which is at a maximum height in a center portion and a minimum height at both end portions of the sidewalls.

13. An imager structure as in claim 1, further comprising a plurality of protrusions formed within at least one of said plurality of containing structures with said microlens structure being formed around said plurality of protrusions.

14. An imager structure as in claim 1, wherein said lens material transitions from said liquid-phase lens material to a convex shaped solid-phase lens structure after heat processing.

15. An imager structure as in claim 1, wherein said lens material transitions from said liquid-phase lens material to a concave shaped solid phase of said lens structure after heat processing.

16. An imager structure as in claim 1, wherein one or more said containing structures are formed from a light absorbing material or a transparent material.

17. An imager structure comprising:
   a plurality of pixels formed in a substrate;
   a planar layer formed over said plurality of pixels, a plurality of openings being formed in said planar layer, each of said plurality of openings being respectively formed over one of said plurality of pixels, each of said plurality of openings comprises a plurality of sidewalls with an inwardly facing surface and a floor surface; and
   lens material deposited in each said plurality of openings;
   wherein each of said plurality of sidewalls contains and defines the outer boundary of said lens material during a liquid-phase of said lens material which result in lens material shape alterations caused in part by heating of said lens material, wherein the height of said lens material after heating is dependent on one or more dimensions and one or more surfaces of said plurality of sidewalls based upon at least surface interactions between said sidewalls and said lens material during a liquid-phase to solid-phase change of said lens material in said plurality of openings.

18. An imager structure of claim 17, wherein said sidewalls are formed into a curved shape.

19. A lens frame structure comprising:
a plurality of frames, each frame defining a frame space, each frame comprising a first upwardly facing surface and a second inwardly facing surface, said inwardly facing surface comprising a substantially flat portion.
wherein each of said plurality of frames is adapted to receive and interact with a liquid-phase lens material by tension and adhesion force to form a lens shape, and
wherein said inwardly facing surface is formed with laterally sloping side end portions below said substantially flat portion.

20. The lens frame structure of claim 19, further comprising a plurality of protrusions formed within said plurality of frames.

21. A lens frame structure comprising:
a plurality of frames, each frame defining a frame space, each frame comprising a first upwardly facing surface and a second inwardly facing surface, said inwardly facing surface comprising a substantially flat portion,
wherein each of said plurality of frames is adapted to receive and interact with a liquid-phase lens material by tension and adhesion force to form a lens shape, and
wherein said inwardly facing surface has a greater inward protrusion into said space defined by each of said plurality of frames at a first point than another point below said substantially flat portion.

22. The lens frame structure of claim 21, wherein each of said plurality of frames is not in contact with other of said plurality of frames.

23. A lens frame structure comprising:
a plurality of frames, each frame defining a frame space, each frame comprising a first upwardly facing surface and a second inwardly facing surface, said inwardly facing surface comprising a substantially flat portion; and
a plurality of protrusions formed within said plurality of frames,
wherein each of said plurality of frames is adapted to receive and interact with a liquid-phase lens material by tension and adhesion force to form a lens shape, and
wherein said plurality of protrusions are formed on said first upwardly facing surface.

24. An image processing system, comprising:
a semiconductor substrate;
a plurality of image pixels formed in said semiconductor substrate;
a planar layer formed over the image pixels, said layer having a top surface, a plurality of lens structures comprising a plurality of frames each defining a space, each of said plurality of frames comprising a first upwardly facing surface and a second inwardly facing surface, said inwardly facing surface comprising a substantially flat portion; and
a lens formed within each of said frames by surface adhesion force interaction with a liquid-phase lens material which solidifies as said lens, said frames defining at least in part a shape of said lens,
wherein said inwardly facing surface is formed with laterally sloping side end portions below said substantially flat portion.

25. The image processing system of claim 24, further comprising a plurality of protrusions formed within said plurality of frames.

26. An image processing system, comprising:
a semiconductor substrate;
a plurality of image pixels formed in said semiconductor substrate;
a planar layer formed over the image pixels, said layer having a top surface, a plurality of lens structures comprising a plurality of frames each defining a space, each of said plurality of frames comprising a first upwardly facing surface and a second inwardly facing surface, said inwardly facing surface comprising a substantially flat portion; and
a lens formed within each of said frames by surface adhesion force interaction with a liquid-phase lens material which solidifies as said lens, said frames defining at least in part a shape of said lens,
wherein said inwardly facing surface has a greater inward protrusion into said space defined by each of said plurality of frames at a first point than another point below said substantially flat portion.

27. The image processing system of claim 26, wherein each of said plurality of frames is not in contact with other of said plurality of frames.

28. An image processing system, comprising:
a semiconductor substrate;
a plurality of image pixels formed in said semiconductor substrate;
a planar layer formed over the image pixels, said layer having a top surface, a plurality of lens structures comprising a plurality of frames each defining a space, each of said plurality of frames comprising a first upwardly facing surface and a second inwardly facing surface, said inwardly facing surface comprising a substantially flat portion;
a lens formed within each of said frames by surface adhesion force interaction with a liquid-phase lens material which solidifies as said lens, said frames defining at least in part a shape of said lens; and
a plurality of protrusions formed within said plurality of frames,
wherein said plurality of protrusions are formed on said first upwardly facing surface.

29. A lens structure comprising:
a planar layer;
a plurality of protrusions formed on an upwardly facing surface of said planar layer; and
a plurality of liquid-phase lens material disposed around said protrusions, whereby said liquid-phase lens material assumes a shape related to a plurality of surface interactions, a surface tension force and a geometric shape of said plurality of protrusions.

30. A lens structure of claim 29, wherein said protrusions are formed as rectangular protrusions extending vertically from said upwardly facing surface.

31. A method of forming an imager structure comprising:
forming a plurality of pixels in a substrate;
depositing a planar layer over said plurality of pixels;
forming a plurality of containing structures comprising a plurality of sidewalls from said planar layer over said plurality of pixels; and
forming a microlens structure in each one of said plurality of containing structures from lens material deposited within said containing structures; and transitioning said lens material to a liquid-phase for a predetermined time to permit flowing of said lens material,
wherein each of said sidewalls are adapted to exert a force on said lens material during the liquid-phase that alters said lens material shape, said lens material height after said lens material transitions to a solid-phase being dependent on at least one dimension of said sidewalls.

32. The method of claim 31, where said step of forming a plurality of containing structures further comprises forming said plurality of sidewalls with an inwardly sloping inner sidewall surface.

33. The method of claim 31, wherein said step of forming a plurality of containing structures further comprises forming said plurality of sidewalls with laterally sloping sidewalls.

34. The method of claim 31, wherein said step of forming a plurality of containing structures further comprises forming said plurality of sidewalls with a greater inward protrusion at a first point than another point.

35. The method of claim 34, wherein said first point is a lower portion of said sidewalls and said another point is a higher portion of said sidewalls.

36. The method of claim 31, wherein said sidewalls have a sloping end portion that slopes down to a corner area formed at the intersection portions of said plurality of sidewalls.

37. The method of claim 31, wherein said sidewalls are formed with a downward sloping height from a top section of the sidewall to an end portion of each said sidewall on both ends symmetrically.

38. A method of claim 31, wherein said sidewalls are formed with a sidewall height which is at a maximum height in a center portion and a minimum height at both end portions of the sidewalls.

39. The method of claim 31, further comprising a plurality of protrusions formed within at least one of said plurality of containing structures with said microlens structure being formed around said plurality of protrusions.

40. The method of claim 31, further comprising transitioning said lens material from said liquid-phase lens material to a convex shaped solid-phase lens structure by heat processing.

41. The method of claim 31, further comprising transitioning said lens material from said liquid-phase lens material to a concave shaped solid phase said lens structure by heat processing.

42. The method of claim 31, wherein one or more said containing structures are formed from a transparent or light absorbing material.

43. The method of claim 31, wherein said predetermined time for said step of transitioning said lens material to a liquid phase is determined based on a time period for said lens material to transition to a solid-phase before said liquid-phase lens material achieves equilibrium.

44. A method of forming a lens comprising:
forming a frame comprising a plurality of surfaces defining an opening with an upwardly facing surface and an inwardly facing surface, said inwardly facing surface comprising a substantially flat portion;
disposing a unit of solid-phase lens material within said frame;
liquefying said unit of solid-phase lens material to form a unit of liquid-phase lens material within said frame, said unit of liquid-phase lens material having a first surface tension force therewithin;
adhering a first surface of said liquid-phase lens material to a second surface of said frame in response to a second adhesive force between said liquid-phase lens material and said frame;
forming an upwardly facing surface of said liquid-phase lens material into a first liquid lens topography in response to said first and second forces; and
solidifying said unit of liquid-phase lens material to form a solid-phase lens having a second solid lens topography related to said first liquid lens topography,
wherein said step of forming a frame comprising a plurality of surfaces further comprises forming said plurality of surfaces to have laterally sloping end portions below said substantially flat portion.

45. A method of forming a lens comprising:
forming a frame comprising a plurality of surfaces defining an opening with an upwardly facing surface and an inwardly facing surface, said inwardly facing surface comprising a substantially flat portion;
disposing a unit of solid-phase lens material within said frame;
liquefying said unit of solid-phase lens material to form a unit of liquid-phase lens material within said frame, said unit of liquid-phase lens material having a first surface tension force therewithin;
adhering a first surface of said liquid-phase lens material to a second surface of said frame in response to a second adhesive force between said liquid-phase lens material and said frame;
forming an upwardly facing surface of said liquid-phase lens material into a first liquid lens topography in response to said first and second forces; and
solidifying said unit of liquid-phase lens material to form a solid-phase lens having a second solid lens topography related to said first liquid lens topography,
wherein said step of disposing a unit of solid-phase lens material within a frame comprises over-filling said frame with lens material such that said liquid-phase lens material is formed into a convex lens.

46. A method of forming a lens comprising:
forming a frame comprising a plurality of surfaces defining an opening with an upwardly facing surface and an inwardly facing surface, said inwardly facing surface comprising a substantially flat portion;
disposing a unit of solid-phase lens material within said frame;
liquefying said unit of solid-phase lens material to form a unit of liquid-phase lens material within said frame, said unit of liquid-phase lens material having a first surface tension force therewithin;
adhering a first surface of said liquid-phase lens material to a second surface of said frame in response to a second adhesive force between said liquid-phase lens material and said frame;
forming an upwardly facing surface of said liquid-phase lens material into a first liquid lens topography in response to said first and second forces;
solidifying said unit of liquid-phase lens material to form a solid-phase lens having a second solid lens topography related to said first liquid lens topography; and
forming a plurality of protrusions arising from an upwardly facing surface of said frame, said step of disposing a unit of solid phase lens material within said frame is performed after said act of forming a plurality of protrusions.

47. A method of forming an imager structure, comprising:
forming a plurality of pixels in a substrate;
forming a planar layer over said plurality of pixels;
forming a plurality of protrusions from said planar layer, each of said protrusions are formed over one of said plurality of pixels;
forming a plurality of lens material respectively over each of said plurality of protrusions; and
heating said plurality of lens materials to transition said lens material to liquid-phase, each of said plurality of liquid-phase lens materials assumes a shape related to a geometric shape of a respective said plurality of protrusions as well as a plurality of surface interactions with a respective said plurality of protrusions and said planar layer including a surface tension force, an effect of a change in volume on said liquid-phase lens material caused by a presence of one of said plurality of protrusions within each of said plurality of liquid-phase lens materials, an adhesive force with said protrusions and a gravitational force.

48. The method of claim 47, wherein said protrusions are formed as rectangular protrusions extending vertically from said planar surface.

49. An imager lens structure comprising:
a containing structure formed over a pixel; and
a lens formed by a solidified lens material deposited in liquid phase in said containing structure, said lens having a shape defined by an interaction of said containing structure and surface tension force of said deposited lens material, wherein said containing structure includes a plurality of sidewalls, said lens having a height which is dependent on at least one dimension of said sidewalls.

50. The imager lens structure of claim 49, wherein said plurality of sidewalls are formed with an inwardly sloping inner sidewall surface.

51. The imager lens structure of claim 49, wherein said plurality of sidewalls are formed with laterally sloping sidewalls.

52. The imager Lens structure of claim 49, wherein said plurality of sidewalls have a greater inward protrusion at a first point than another point.

53. An imager structure as m claim 52, wherein said first point is a lower portion of said sidewalls and said another point is a higher portion of said sidewalls.

54. The imager lens structure of claim 49, wherein said sidewalls have a sloping end portion that slopes down to corner areas formed at intersection portions of said plurality of sidewalls.

55. The imager lens structure of claim 49, wherein said sidewalls have a sloping end portion that slopes up from a center portion to corner areas formed at intersection portions of said plurality of sidewalls.

56. The imager lens structure of claim 49, wherein said plurality of sidewalls have laterally sloping sides that have a higher portion in a middle portion of said plurality of sidewalls and another portion of said plurality of sidewalls that slopes downward from a portion about mid-way from said middle portion to an end section of each of said plurality of sidewalls.

57. The imager lens structure of claim 49, wherein said sidewalls have an opening therein sloping upward from a bottom center section of the sidewall to end portions of each said sidewall on both ends symmetrically.

58. The imager lens structure of claim 49, wherein said sidewalls have a downward sloping height from a top section of the sidewall to an end portion of each said sidewall on both ends symmetrically.

59. The imager lens structure of claim 49, wherein said sidewalls have a sidewall height which is at a maximum height in an end portion and a minimum height at center portion of the sidewalls.

60. The imager lens structure of claim 49, wherein said sidewalls have a sidewall height which is at a maximum height in a center portion and a minimum height at both end portions of the sidewalls.

61. The imager lens structure of claim 49, further comprising a plurality of protrusions formed within at least one of said plurality of containing structures with said lens being formed around said plurality of protrusions.

62. The imager lens structure of claim 49, wherein said lens has a convex shape.

63. The imager lens structure of claim 49, wherein said lens has a concave shape.

64. The imager lens structure of claim 49, wherein said containing structure is formed from a light absorbing material.

65. The imager lens structure of claim 49, wherein said containing structure is formed from a transparent material.

66. A lens structure comprising:
a plurality of frames, each frame defining a frame space, each frame comprising an upwardly facing surface and an inwardly facing surface, said inwardly facing surface comprising a substantially flat portion; and
a formed lens within each said frame, each lens having a topography related to at least an adhesive force between a liquid-phase lens material formed into said lens and said inwardly facing surface,
wherein said inwardly facing surface has a non-uniform height.

67. A lens structure comprising:
a plurality of frames, each frame defining a frame space, each frame comprising an upwardly facing surface and an inwardly facing surface, said inwardly facing surface comprising a substantially flat portion; and
a formed lens within each said frame, each lens having a topography related to at least an adhesive force between a liquid-phase lens material formed into said lens and said inwardly facing surface,
wherein said inwardly facing surface comprises a substantially horizontal portion and at least one angled portion.

68. A lens structure comprising:
a plurality of frames, each frame defining a frame space, each frame comprising an upwardly facing surface and an inwardly facing surface, said inwardly facing surface comprising a substantially flat portion; and
a formed lens within each said frame, each lens having a topography related to at least an adhesive force between a liquid-phase lens material formed into said lens and said inwardly facing surface,
wherein each of said plurality of frames comprises a plurality of inwardly facing surfaces
wherein each of said inwardly facing surfaces comprises a substantially horizontal portion and at least one angled portion.

69. The lens structure of claim 67, wherein said at least one angled portion comprises a lower part and an upper part, said upper part in contact with said substantially horizontal portion.

70. The lens structure of claim 68, wherein said at least one angled portion comprises a lower part and an upper part, said upper part in contact with said substantially horizontal portion.

71. The lens structure of claim 70, wherein said lower part of said at least one angled portion of at least one of said plurality of inwardly facing surfaces is in contact with a lower part of at least one angled portion of another of said plurality of inwardly facing surfaces.

* * * * *

UNITED STATES PATENT AND TRADEMARK OFFICE
CERTIFICATE OF CORRECTION

PATENT NO. : 7,280,278 B2
APPLICATION NO. : 10/857948
DATED : October 9, 2007
INVENTOR(S) : Boettiger et al.

It is certified that error appears in the above-identified patent and that said Letters Patent is hereby corrected as shown below:

In column 13, line 12, in Claim 19, after "portion" delete "." and insert -- , --, therefor.

In column 17, line 41, in Claim 52, delete "Lens" and insert -- lens --, therefor.

In column 17, line 44, in Claim 53, delete "m" and insert -- in --, therefor.

Signed and Sealed this

Twenty-fifth Day of December, 2007

JON W. DUDAS
*Director of the United States Patent and Trademark Office*